(12) United States Patent
Lee et al.

(10) Patent No.: US 11,272,626 B2
(45) Date of Patent: Mar. 8, 2022

(54) DISPLAY DEVICE

(71) Applicant: LG Display Co., Ltd., Seoul (KR)

(72) Inventors: SeungHee Lee, Goyang-si (KR); Hyosung Lee, Gwangmyeong-si (KR); MiJin Han, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/939,833

(22) Filed: Jul. 27, 2020

(65) Prior Publication Data

US 2021/0045258 A1 Feb. 11, 2021

(30) Foreign Application Priority Data

Aug. 6, 2019 (KR) .................. 10-2019-0095727

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ..... G09F 9/301; G06F 1/1652; H05K 5/0017; H05K 5/0217; H05K 2201/10128
See application file for complete search history.

(56) References Cited

U.S. PATENT DOCUMENTS

| 8,967,005 | B2 | 3/2015 | Saji et al. | |
| 9,269,650 | B2 | 2/2016 | Lee | |
| 9,756,757 | B2 * | 9/2017 | Park | H05K 5/0017 |
| 10,789,863 | B2 * | 9/2020 | Song | H05K 1/189 |
| 2010/0059727 | A1 * | 3/2010 | Suko | B66F 3/06 254/358 |
| 2011/0011542 | A1 * | 1/2011 | Kuroi | G03B 21/58 160/133 |
| 2012/0204453 | A1 * | 8/2012 | Jung | G09F 9/301 40/517 |
| 2013/0312554 | A1 | 11/2013 | Saji et al. | |
| 2015/0028363 | A1 | 1/2015 | Lee | |
| 2016/0139633 | A1 * | 5/2016 | Lee | G06F 1/1652 345/33 |
| 2016/0155965 | A1 * | 6/2016 | Kusu | H01L 51/0024 361/749 |
| 2016/0161983 | A1 * | 6/2016 | Lee | G06F 1/1652 361/749 |
| 2016/0324021 | A1 * | 11/2016 | Takayanagi | G06F 1/1652 |

(Continued)

FOREIGN PATENT DOCUMENTS

KR 10-2010-0073348 A 7/2010
KR 10-2013-0132976 A 12/2013
(Continued)

*Primary Examiner* — Hung S. Bui
*Assistant Examiner* — Sagar Shrestha
(74) *Attorney, Agent, or Firm* — Fenwick & West LLP

(57) ABSTRACT

Provided is a display device. The display device includes a display panel including a plurality of pixels. The display device further includes a roller to which the display panel is wound or unwound. The display device further includes a lifting unit configured to move the display panel in a vertical direction. The lifting unit lifting unit includes a plurality of unit blocks and a plate to which the plurality of unit blocks is fixed. Therefore, the structure of the lifting unit is simplified to improve the durability and the rocking.

19 Claims, 13 Drawing Sheets

(56) References Cited

U.S. PATENT DOCUMENTS

| | | | | |
|---|---|---|---|---|
| 2016/0374228 A1* | 12/2016 | Park | ............................ | H05K 7/16 |
| 2017/0013726 A1* | 1/2017 | Han | ............................ | H05K 5/03 |
| 2017/0367198 A1* | 12/2017 | Park | ...................... | H01L 51/5237 |
| 2018/0070466 A1* | 3/2018 | Kim | ...................... | H05K 5/0217 |
| 2018/0103551 A1* | 4/2018 | Park | ........................ | G06F 1/1652 |
| 2019/0324502 A1* | 10/2019 | Chang | .................. | H05K 5/0217 |

FOREIGN PATENT DOCUMENTS

| | | |
|---|---|---|
| KR | 10-2015-0012118 A | 2/2015 |
| KR | 10-2015-0079507 A | 7/2015 |
| KR | 10-2018-0029646 A | 3/2018 |
| KR | 10-2018-0030435 A | 3/2018 |

* cited by examiner

DISPLAY DEVICE

CROSS-REFERENCE TO RELATED APPLICATIONS

This application claims the priority of Republic of Korea Patent Application No. 10-2019-0095727 filed on Aug. 6, 2019, in the Korean Intellectual Property Office, the disclosure of which is incorporated by reference in its entirety.

BACKGROUND

Field

The present disclosure relates to a display device, and more particularly, to a rollable display device which is capable of displaying images even in a rolled state.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display unit and a wiring line on a flexible substrate such as plastic which is a flexible material so as to be capable of displaying images even though the display device is rolled is getting attention as a next generation display device.

SUMMARY

An object to be achieved by the present disclosure is to provide a display device which simplifies a lifting unit to improve a durability and rocking.

Another object to be achieved by the present disclosure is to provide a display device which is capable of ensuring a competitive price.

Still another object to be achieved by the present disclosure is to provide a display device which reduces breakage of a display device due to an external impact applied to a side surface of the display device by enhancing a rigidity of the side surface of the display device.

Still another object to be achieved by the present disclosure is to provide a display device which reduces a risk of an injury of a user by improving a sharp edge of a back cover.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device includes a display panel in which a plurality of pixels is defined. The display device further includes a roller to which the display panel is wound or unwound. The display device further includes a lifting unit configured to move the display panel in a vertical direction. The lifting unit lifting unit includes a plurality of unit blocks and a plate to which the plurality of unit blocks is fixed.

According to another aspect of the present disclosure, there is provided a display device. The display device includes a display panel in which a plurality of pixels is defined. The display device further includes a back cover configured to be rolled together with the display panel. The display device further includes a roller which winds and unwinds the display panel and the back cover. The display device further includes a lifting unit configured to move the display panel in a vertical direction. The lifting unit includes a plurality of unit blocks which has a groove formed on a top surface and a plate which fixes the plurality of unit blocks in one line.

Other detailed matters of the exemplary embodiments are included in the detailed description and the drawings.

According to the present disclosure, components of the lifting unit are reduced to reduce a manufacturing cost of the display device.

According to the present disclosure, the structure of the lifting unit is simplified to improve the durability and the rocking, thereby improving the reliability of the display device.

According to the present disclosure, a sharp edge of the back cover is improved to reduce danger of injury to the user.

According to the present disclosure, the rigidity at the side surface of the back cover is increased to reduce deformation of the back cover due to an external impact.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
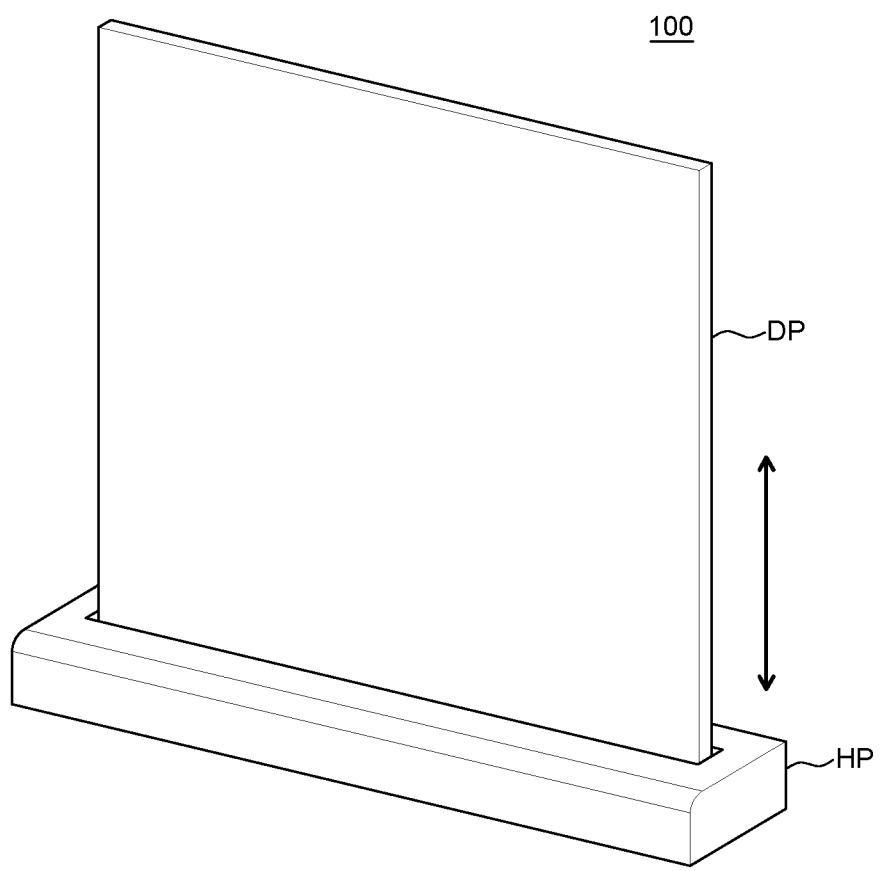
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Display Device-Rollable Display Device

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
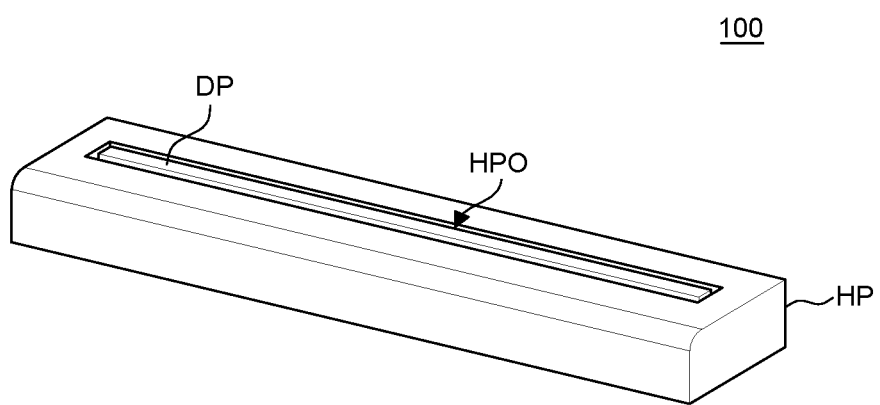
Figure 2:
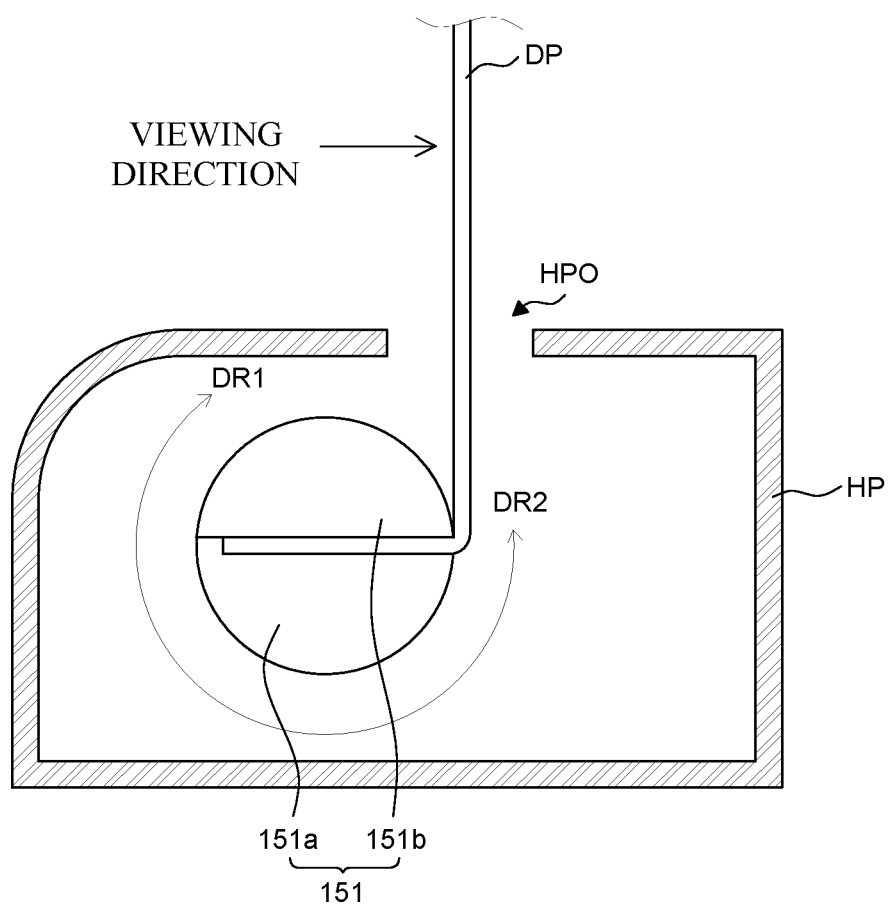
FIG. 2 is a cross-sectional view of a display device according to an exemplary embodiment of the present disclosure.

FIGS. 1A and 1B are perspective views of a display device according to an exemplary embodiment of the present disclosure. FIG. 2 is a cross-sectional view of a display device according to an exemplary embodiment of the present disclosure.

First, referring to FIGS. 1A and 1B, a display device 100 according to an exemplary embodiment of the present disclosure includes a display unit DP and a housing unit HP.

The display unit DP is a configuration for displaying images to a user and for example, in the display unit DP, a display element and a circuit, a wiring line, and a component for driving the display element may be disposed. In this case, since the display device 100 according to the exemplary embodiment of the present disclosure is a rollable display device 100, the display unit DP may be configured to be wound and unwound. For example, the display unit DP may be formed of a display panel and a back cover each having flexibility to be wound or unwound. The display unit DP will be described below in more detail with reference to FIGS. 3 and 4.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO through which the display unit DP moves to the inside and the outside of the housing unit HP. The display unit DP may move in a vertical direction by passing through the opening HPO of the housing unit HP.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

Referring to FIG. 2, the display unit DP may be switched to a fully unwound state or a fully wound state by a roller 151 of a driving unit MP to be described below. For the convenience of description, in FIG. 2, only the housing unit HP, the display unit DP, and the roller 151 are illustrated.

The roller 151 is a member around which the display unit DP is wound. Specifically, the roller 151 rotates in a clockwise direction or a counterclockwise direction to wind or unwind the display unit DP fixed to the roller 151. A lower edge of the display unit DP may be fixed to the roller 151. When the roller 151 rotates, the display unit DP fixed to the roller 151 through the lower edge may be wound around the roller 151. In contrast, when the roller 151 rotates in an opposite direction, the display unit DP wound around the roller 151 may be unwound from the roller 151.

Specifically, when the display unit DP is wound, the roller 151 may rotate and the display unit DP may be wound around the roller 151. When the roller 151 rotates in a first direction DR1, that is, in a clockwise direction, the display unit DP may be wound while a front surface of the display unit DP which is a viewing direction is in close contact with a surface of the roller 151. When the display unit DP is unwound, the roller 151 may rotate and the display unit DP may be unwound from the roller 151. When the roller 151 rotates in a second direction DR2, that is, in a counterclockwise direction, the display unit DP wound around the roller 151 is unwound from the roller 151 to be disposed at the outside of the housing unit HP.

The roller 151 may include a base unit 151a and a top cover 151b. The lower edge of the display unit DP is fixed between the base unit 151a and the top cover 151b to be fastened with the roller 151. The roller 151 may be formed to have a cylindrical shape. That is, an overall shape of the roller 151 after fixing the base unit 151a, the top cover 151b, and the display unit DP may be a cylindrical shape. However, the roller 151 may have an arbitrary shape which may wind the display unit DP, but is not limited thereto.

Further, a spring is disposed on at least one side of the roller 151 to apply a force to a winding direction of the roller 151 using a tension of the spring. Therefore, when the display unit DP is fully unwound, the tension is applied to the display unit DP to be maintained in a flat state and to easily wind the display unit DP.

Display Unit

Figure 3:
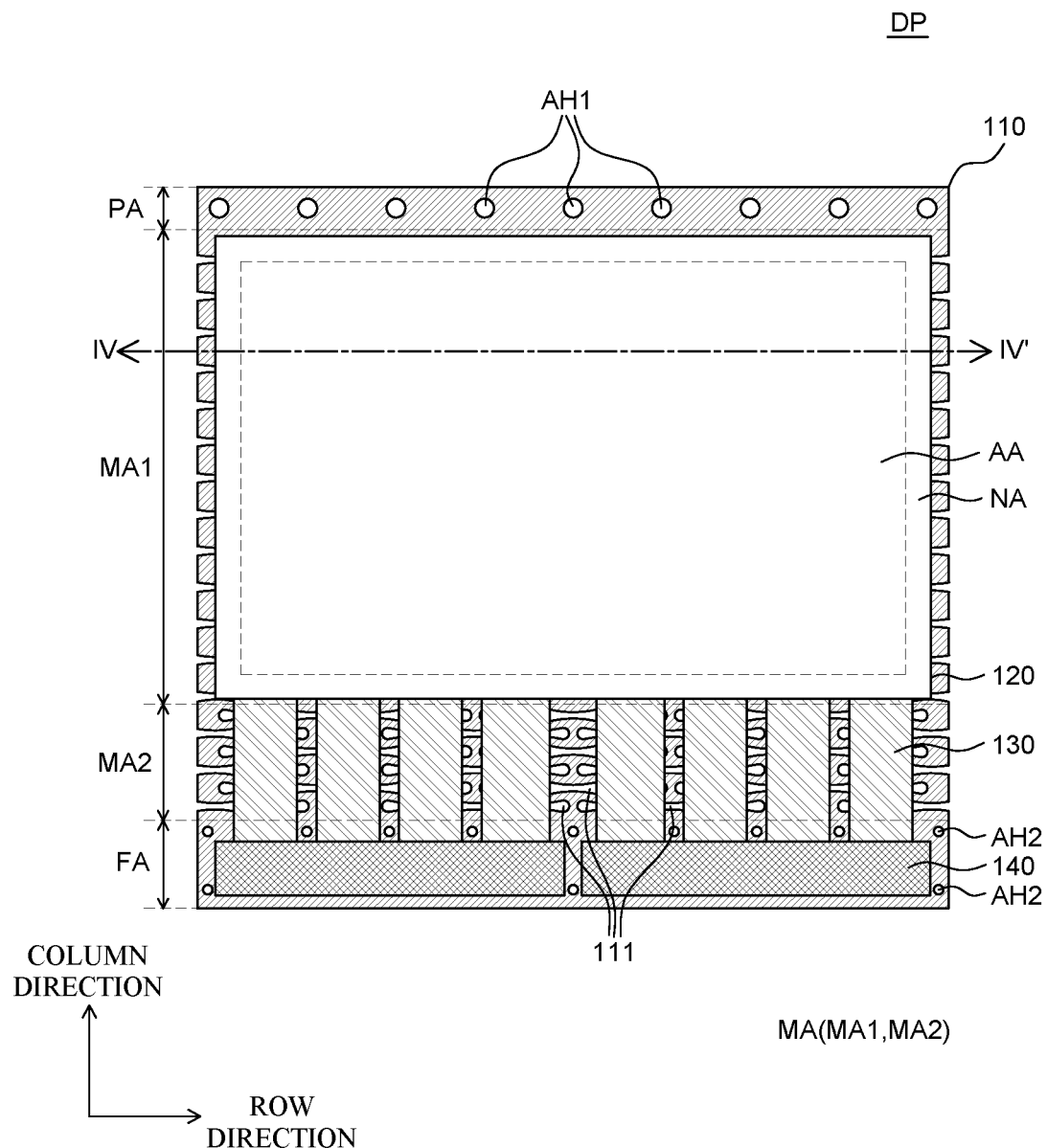
FIG. 3 is a plan view of a display unit of a display device according to an exemplary embodiment of the present disclosure.
Figure 4:
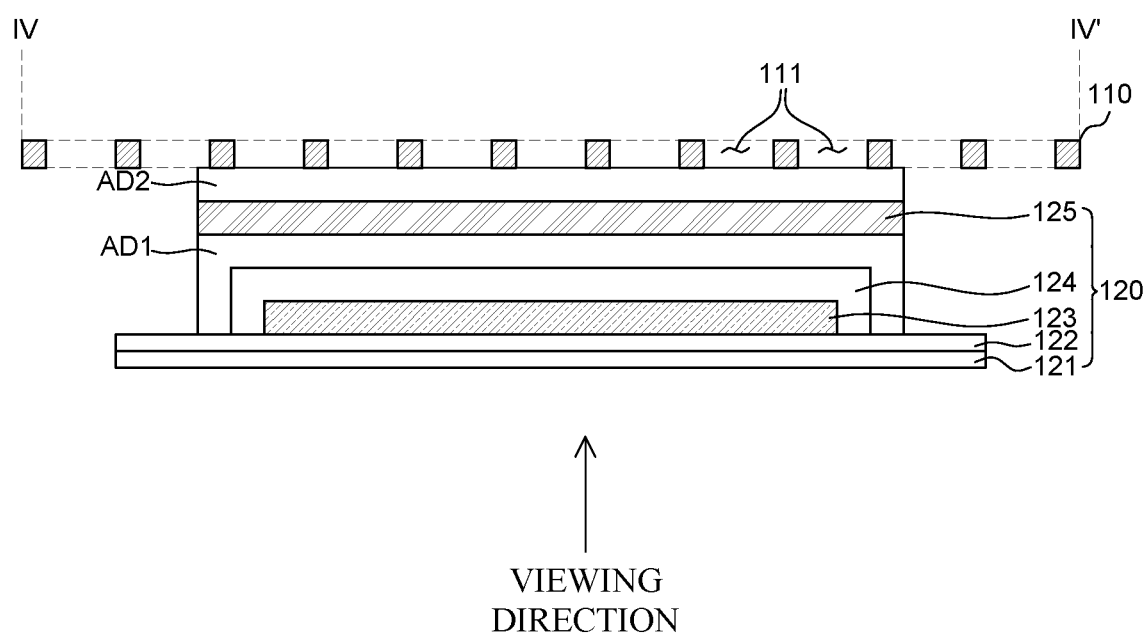
FIG. 4 is a cross-sectional view taken along the line IV-IV' of FIG. 3 according to an exemplary embodiment of the present disclosure.

FIG. 3 is a plan view of a display unit of a display device according to an exemplary embodiment of the present disclosure. FIG. 4 is a cross-sectional view taken along the line IV-IV' of FIG. 3.

First, referring to FIG. 3, the display unit DP of the display device 100 includes a back cover 110, a display panel 120, a flexible film 130, and a printed circuit board 140.

The back cover 110 is disposed on rear surfaces of the display panel 120, the flexible film 130, and the printed circuit board 140 to support the display panel 120, the flexible film 130, and the printed circuit board 140. Therefore, a size of the back cover 110 may be larger than a size of the display panel 120. That is, an outer edge of the back cover 110 may be disposed outside more than a corresponding outer edge of the display panel 120. Therefore, when the display unit DP is disposed at the outside of the housing unit HP, the back cover 110 may protect another configuration of the display unit DP, specifically, the display panel 120 from the external impact.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, if the material of the back cover 110 satisfies physical conditions such as a thermal strain amount, a radius of curvature, and a rigidity, the material may be diversely changed, and is not limited thereto.

The back cover 110 includes a fixing area FA, a support area PA, and a malleable area MA. Specifically, the back cover 110 includes the support area PA at an uppermost end, the fixing area FA at a lowermost end, and the malleable area MA between the support area PA and the fixing area FA. In the support area PA, a plurality of openings 111 is not disposed and a head bar 171 to be described below is fastened therewith. In the malleable area MA, a plurality of openings 111 is disposed and the winding or unwinding is substantially performed. The fixing area FA is an area where the back cover 110 is fixed to the roller 151 together with the printed circuit board 140 and the flexible film 130.

Figure 6:
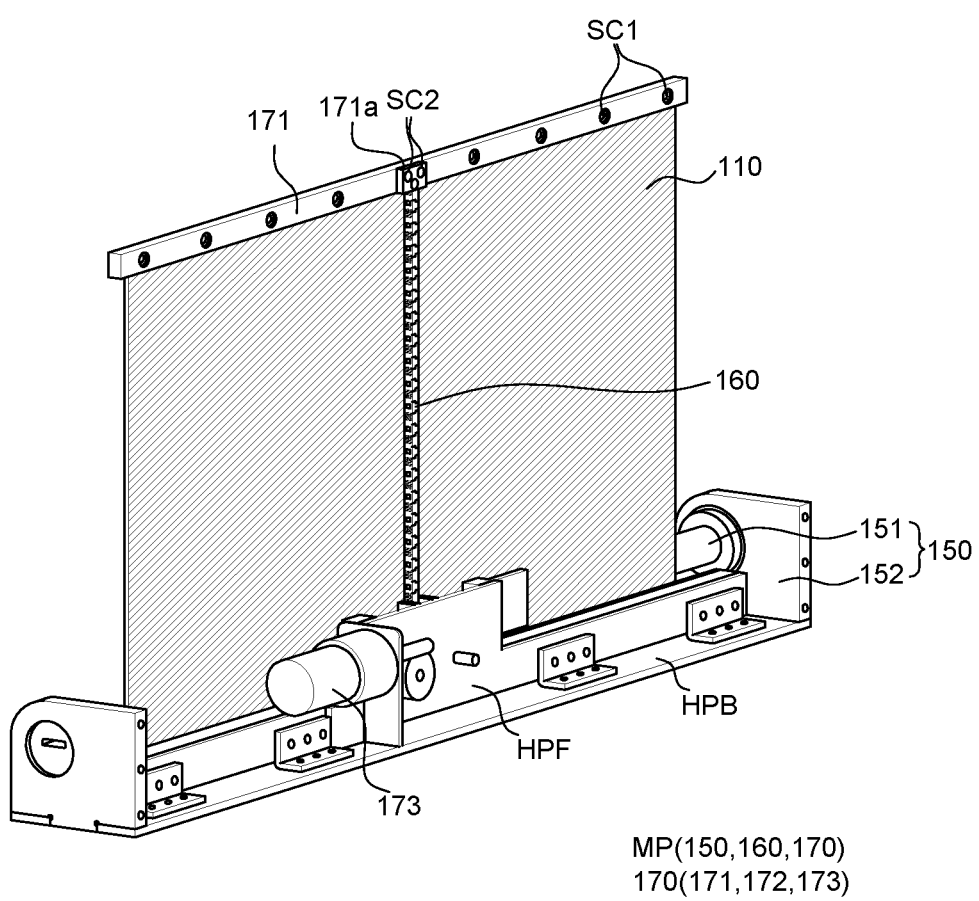
FIG. 6 is a perspective view of a driving unit of a display device according to an exemplary embodiment of the present disclosure.

The support area PA of the back cover 110 is an uppermost area of the back cover 110 and is fastened with the head bar 171. The support area PA includes first fastening holes AH1 to be fastened with the head bar 171. As illustrated in FIG. 6, screws SC1 which pass through the head bar 171 and the first fastening holes AH1 are disposed to fasten the head bar 171 with the support area PA of the back cover 110. As the support area PA is fastened with the head bar 171, when the lifting unit 160 fastened with the head bar 171 moves up or down, the back cover 110 moves up or down together with the display panel 120 which is attached to the back cover 110. Even though nine first fastening holes AH1 are illustrated in FIG. 3, the number of first fastening holes AH1 is not limited thereto. Further, even though it is described that the back cover 110 is fastened with the head bar 171 using the first fastening holes AH1 in FIG. 3, it is not limited thereto and the back cover 110 and the head bar 171 may be fastened with each other without using a separate fastening hole.

The fixing area FA of the back cover 110 is a lowermost area of the back cover 110 and is fastened with the roller 151. The fixing area FA may include second fastening holes AH2 to be fastened with the roller 151. For example, screws which pass through the roller 151 and the second fastening holes AH2 are disposed to fasten the roller 151 and the fixing area FA of the back cover 110 with each other. As the fixing area FA is fastened with the roller 151, the back cover 110 may be wound around or unwound from the roller 151 by the rotation of the roller 151. In the meantime, the number of the plurality of second fastening holes AH2 illustrated in FIG. 3 is illustrative and the number of the plurality of second fastening holes AH2 may be determined based on the number of printed circuit board 140 and the number of flexible films 130.

In the fixing area FA, the flexible film 130 connected to one end of the display panel 120 and the printed circuit board 140 are disposed to be fixed. Some of the second fastening holes AH2 is disposed between the flexible films 130 to more stably fix the flexible films 130. In order to protect the flexible film 130 and the printed circuit board 140, the fixing area FA may allow the flexible film 130 and the printed circuit board 140 to be fastened with the roller 151 in a flat shape, rather than in a curved shape. Further, a part of the roller 151 may be formed to be flat, correspondingly to the fixing area FA. A detailed description thereof will be made below with reference to FIG. 5.

The malleable area MA of the back cover 110 is an area which is wound around or unwound from the roller 151 together with the display panel 120. The malleable area MA may overlap the display panel 120 and a partial area of the flexible film 130.

The plurality of openings 111 is disposed in the malleable area MA of the back cover 110. When the display unit DP is wound or unwound, the plurality of openings 111 may be deformed by a stress which is applied to the display unit DP. Specifically, when the display unit DP is wound or unwound, the malleable area MA of the back cover 110 may be deformed as the plurality of openings 111 contracts or expands. Further, as the plurality of openings 111 contracts or expands, a slip phenomenon of the display panel 120 disposed on the malleable area MA of the back cover 110 is reduced so that the stress which is applied to the display panel 120 may be minimized.

When the back cover 110 and the display panel 120 are wound, a difference between a length of the back cover 110 which is wound around the roller 151 and a length of the display panel 120 which is wound around the roller 151 may be caused due to the difference of radii of curvature of the back cover 110 and the display panel 120. For example, when the back cover 110 and the display panel 120 are wound around the roller 151, a length of the back cover 110 required for being wound around the roller 151 once may be different from a length of the display panel 120 required for being wound around the roller 151 once. That is, since the back cover 110 is disposed outer than the display panel 120 with respect to the roller 151, a length of the back cover 110 required to be wound around the roller 151 once may be larger than a length of the display panel 120 required to be wound around the roller 151 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or defects such as cracks may be caused.

In this case, in the display device 100 according to the exemplary embodiment of the present disclosure, even though the display unit DP is wound or unwound and a stress is applied to the display unit DP, the plurality of openings 111 of the back cover 110 is flexibly deformed to alleviate the stress applied to the back cover 110 and the display panel 120. For example, when the back cover 110 and the display panel 120 are wound around the roller 151, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, a stress applied to the display panel 120 from the back cover 110 due to the deformation of the plurality of openings 111 during the process of winding the back cover 110 and the display panel 120 may also be alleviated.

In the meantime, in the support area PA and the fixing area FA, the plurality of openings 111 as formed in the malleable area MA is not formed. That is, in the support area PA and the fixing area FA, only the first fastening holes AH1 and the second fastening holes AH2 are formed, but the plurality of openings 111 as formed in the malleable area MA is not formed. Further, the first fastening holes AH1 and the second fastening holes AH2 have different shapes from that of the plurality of openings 111. The support area PA and the fixing area FA fixed to the head bar 171 and the roller 151, respectively, need to be more rigid than the malleable area MA. Specifically, as the support area PA and the fixing area FA have rigidity, the support area PA and the fixing area FA may be firmly fixed to the head bar 171 and the roller 151. Therefore, the display unit DP is fixed to the roller 151 and the head bar 171 of the driving unit MP to be moved to the inside or the outside of the housing unit HP in accordance with the operation of the driving unit MP.

In the display device 100 according to the exemplary embodiment of the present disclosure, the back cover 110 with the plurality of openings 111 formed therein is disposed on the rear surface of the display panel 120 to support and protect the display panel 120. The back cover 110 is formed of a metal material to have a rigidity. Simultaneously, in the malleable area MA where the display panel 120 of the back cover 110 is disposed, the plurality of openings 111 is formed so that the flexibility of the back cover 110 may be improved. Therefore, in a fully unwound state in which the display unit DP of the display device 100 is disposed at the outside of the housing unit HP, the back cover 110 which has a high rigidity may support the display panel 120 to be flatly spread. In contrast, in a fully wound state in which the display unit DP of the display device 100 is accommodated in the housing unit HP, the back cover 110 having a high flexibility due to the plurality of openings 111 is wound around the roller 151 together with the display panel 120 to be accommodated.

Referring to FIG. 3, the malleable area MA may include a first malleable area MA1 extending from the support area PA and a second malleable area MA2 between the first malleable area MA1 and the fixing area FA.

The first malleable area MA1 is an area in which a plurality of openings is disposed and the display panel 120 is attached. The second malleable area MA2 is an area extending from the first malleable area MA1 to the fixing area FA. In the second malleable area MA2, the plurality of openings 111 is disposed, but the display panel 120 is not disposed. Further, in the second malleable area MA2, at least a part of the flexible film 130 extending from the display panel 120 to the printed circuit board 140 is disposed.

The second malleable area MA2 extends to dispose the display area AA of the display panel 120 at the outside of the housing unit HP. For example, when the back cover 110 and the display panel 120 are fully unwound, the fixing area FA to which the printed circuit board 140 is attached to be fixed to the roller 151 and the second malleable area MA2 to which the flexible film 130 is attached may be disposed in the housing unit HP and the first malleable area MA1 to which the display panel 120 is attached and the support area PA may be disposed at the outside of the housing unit HP. In this case, when a length from the fixing area FA fixed to the roller 151 to the second malleable area MA2 is smaller than a length from the fixing area FA to the opening HPO of the housing unit HP, a part of the first malleable area MA1 to which the display panel 120 is attached may be disposed in the housing unit HP. Therefore, since a part of the lower end of the display area AA of the display panel 120 is disposed in the housing unit HP, it may be difficult to watch images. Therefore, the length from the fixing area FA fixed to the roller 151 to the second malleable area MA2 may be designed to be equal to the length from the fixing area FA fixed to the roller 151 to the opening HPO of the housing unit HP.

The display panel 120 is a panel for displaying images to a user. The display panel 120 may include a display element which displays images, a driving element which drives the display element, and wiring lines which transmit various signals to the display element and the driving element.

The display element may be defined in different ways depending on a type of the display panel 120. For example, when the display panel 120 is an organic light emitting display panel, the display element may be an organic light emitting diode including an anode, an organic light emitting layer, and a cathode. For example, when the display panel 120 is a liquid crystal display panel, the display element may be a liquid crystal display element. When the display panel 120 is a light emitting display panel including an LED, the display element may be an LED. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device, the display panel 120 may be implemented as a flexible display panel to be wound around or unwound from the roller 151.

Referring to FIG. 3, the display panel 120 includes a display area AA and a non-display area NA.

The display area AA is an area where images are displayed in the display panel 120. In the display area AA, a plurality of sub pixels which configures the plurality of pixels and a driving circuit for driving the plurality of sub pixels may be disposed. The plurality of sub pixels is minimum units which configure the display area AA and a display element may be disposed in each of the plurality of sub pixels. For example, an organic light emitting diode including an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, and a data line, but is not limited thereto.

The non-display area NA is an area where no image is displayed. The non-display area NA is disposed so as to enclose an outer periphery of the display area AA. In the non-display area NA, various wiring lines and circuits for driving the organic light emitting diode of the display area AA are disposed. For example, in the non-display area NA, a link line which transmits signals to the plurality of sub pixels and circuits of the display area AA or a driving IC such as a gate driver IC or a data driver IC may be disposed, but the non-display area is not limited thereto.

The flexible film 130 is a film in which various components are disposed on a base film having a malleability. The flexible film 130 has malleability so that a partial area may be wound around or unwound from the roller 151 together with the second malleable area MA2. The flexible film 130 supplies a signal to the plurality of sub pixels and the circuits of the display area AA and is electrically connected to the display panel 120. The flexible film 130 is disposed at one end of the non-display area NA of the display panel 120 to supply a power voltage or a data voltage to the plurality of sub pixels and the circuits of the display area AA. The number of flexible films 130 illustrated in FIG. 3 is illustrative and the number of flexible films 130 may vary depending on the design, but is not limited thereto.

In the meantime, for example, a driving IC such as a gate driver IC or a data driver IC may also be disposed on the flexible film 130. The driving IC is a component which processes data for displaying images and a driving signal for processing the data. The driving IC may be disposed by a chip on glass (COG), a chip on film (COF), or a tape carrier package (TCP) depending on a mounting method. However, for the convenience of description, it is described that the driving IC is mounted on the flexible film 130 by a chip on film manner, but is not limited thereto.

The printed circuit board 140 is disposed at one end of the flexible film 130 to be connected to the flexible film 130. The printed circuit board 140 is a component which supplies signals to the driving IC. The printed circuit board 140 supplies various signals such as a driving signal or a data signal to the driving IC. Various components may be disposed on the printed circuit board 140. For example, a timing controller and a power source unit may be disposed on the printed circuit board 140. Even though two printed circuit boards 140 are illustrated in FIG. 3, the number of printed circuit boards 140 may vary depending on the design and is not limited thereto.

Even though not illustrated in FIG. 3, an additional printed circuit board connected to the printed circuit board 140 may be further disposed. For example, the printed circuit board 140 may be referred to as a source printed circuit board S-PCB (Source PCB) on which the data driver is mounted and the additional printed circuit board connected to the printed circuit board 140 may be referred to as a control printed circuit board C-PCB (Control PCB) on which the timing controller is mounted. The additional printed circuit board may be disposed in the roller 151 or disposed in the housing unit HP at the outside of the roller 151.

Referring to FIG. 4, the display panel 120 includes a substrate 121, a buffer layer 122, a pixel unit 123, an encapsulating layer 124, and an encapsulating substrate 125.

The substrate 121 is a base member which supports various components of the display panel 120 and may be configured by an insulating material. The substrate 121 may be formed of a material having a flexibility to allow the display panel 120 to be wound or unwound and for example, may be formed of a plastic material such as polyimide PI.

The buffer layer 122 suppresses moisture and/or oxygen which penetrates from the outside of the substrate 121 from being spread. The buffer layer 122 may be configured by a single layer or a double layer of silicon oxide SiOx and silicon nitride SiNx, but is not limited thereto.

The pixel unit 123 includes a plurality of organic light emitting diodes and a circuit for driving the organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. In this case, when the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from the group consisting of metals such as magnesium (Mg), silver (Ag), and aluminum (Al), and an alloy thereof, but is not limited thereto.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit may be formed of a thin film transistor, a storage capacitor, a gate line, a data line, and a power line, but it may vary in various forms depending on the design of the display device 100.

The encapsulating layer 124 which covers the pixel unit 123 is disposed on the pixel unit 123. The encapsulating layer 124 seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulating substrate 125 is disposed on the encapsulating layer 124. The encapsulating substrate 125 protects the organic light emitting diode of the pixel unit 123 together with the encapsulating layer 124. The encapsulating substrate 125 may protect the organic light emitting diode of the pixel unit 123 from moisture, oxygen, and impacts of the outside. The encapsulating substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 may be disposed between the encapsulating layer 124 and the encapsulating substrate 125. The first adhesive layer AD1 may bond the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed to enclose the encapsulating layer 124 and the pixel unit 123. That is, the pixel unit 123 may be sealed by the buffer layer 122 and the encapsulating layer 124 and the encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

The back cover 110 is disposed on the encapsulating substrate 125. The back cover 110 is disposed to be in contact with the encapsulating substrate 125 of the display panel 120 to protect the display panel 120. In order to protect the display panel 120, the back cover 110 may be formed of a material having a rigidity.

A second adhesive layer AD2 is disposed between the encapsulating substrate 125 and the back cover 110. The second adhesive layer AD2 may bond the encapsulating substrate 125 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though in FIG. 4, it is illustrated that the plurality of openings 111 of the back cover 110 is not filled with the second adhesive layer AD2, the second adhesive layer AD2 may be filled in some or all of the plurality of openings 111 of the back cover 110. If the second adhesive layer AD2 is filled in the plurality of openings 111 of the back cover 110, a contact area between the second adhesive layer AD2 and the back cover 110 is increased so that a separation phenomenon may be avoided.

Even though not illustrated in FIG. 4, a light-transmissive film may be further disposed on the entire substrate 121. The light-transmissive film may perform a function of protecting the entire display panel 120 or minimizing the reflection of external light incident onto the display panel 120. For example, the light-transmissive film may be at least one of a polyethyleneterephthalate (PET) film, an anti-reflection film, a polarizer film, and a transmittance controllable film, but is not limited thereto.

Coupling Structure of Display Unit and Roller

Figure 5:
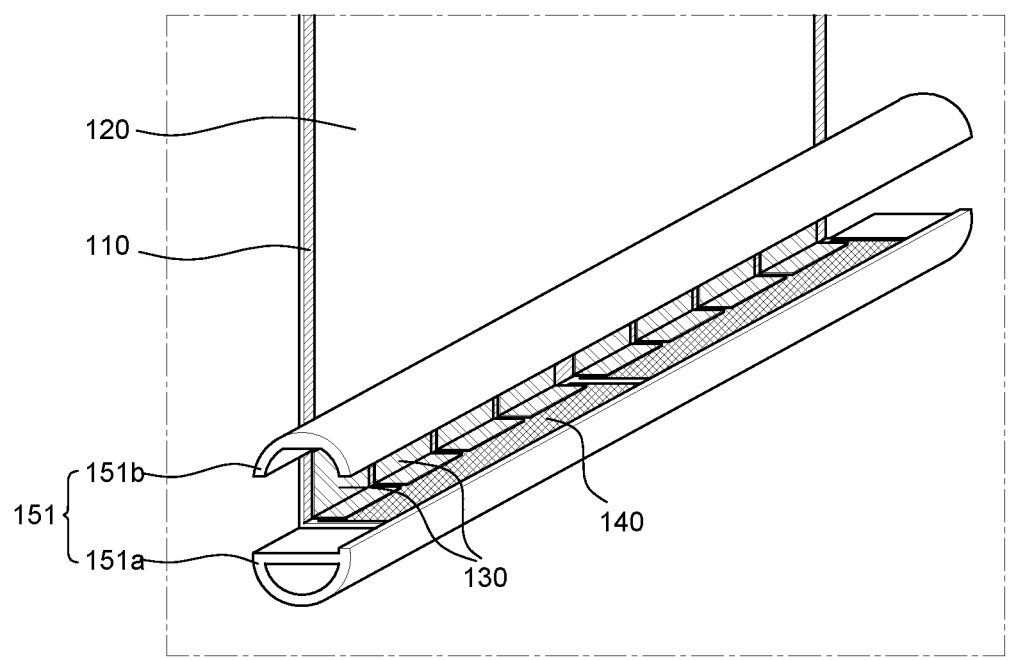
FIG. 5 is an exploded cross-sectional view for explaining a coupling structure of a roller and a display unit of a display device according to an exemplary embodiment of the present disclosure.

FIG. 5 is an exploded cross-sectional view for explaining a coupling structure of a roller and a display unit of a display device according to an exemplary embodiment of the present disclosure.

Referring to FIG. 5, the lower edge of the display unit DP is fixed between the base unit 151a and the top cover 151b of the roller 151. Specifically, the fixing area FA, a part of the flexible film 130, and the printed circuit board 140 are disposed between the base unit 151a and the top cover 151b.

A part of the outer circumferential surface of the base unit 151a is formed to be a flat portion and the remaining part of the outer circumferential surface is formed to be a curved portion. The flat portion of the base unit 151a may be a part in which the fixing area FA, a part of the flexible film 130, and the printed circuit board 140 of the display unit DP are seated. The fixing area FA is fixed to the flat portion of the base unit 151a by the plurality of second fastening holes AH2.

The top cover 151b is fastened on the flat portion of the base unit 151a. More specifically, a screw which passes through the top cover 151b of the roller 151, the fixing area FA of the back cover 110, and the base unit 151a of the roller 151 is disposed to fasten the roller 151 and the fixing area FA.

In this case, a top surface of the top cover 151b may have a convex curved shape. Further, the curved shape of the top cover 151b may have a shape corresponding to the curved portion of the base unit 151a. Therefore, a cross-section of the roller 151 after coupling the base unit 151a and the top cover 151b may have a substantially circular shape. Therefore, after disposing the fixing area FA, the part of the flexible film 130, and the printed circuit board 140 on the flat portion of the base unit 151a, the malleable area MA of the back cover 110 and the display panel 120 may be wound along the outer circumferential surface of the roller 151 having a circular shape.

In the meantime, the printed circuit board 140 disposed in the fixing area FA is disposed on the flat portion of the base unit 151a so as to maintain a flat state without being curved. Therefore, the printed circuit board 140 always maintains a flat state regardless of the winding or unwinding of the display unit DP and the damage caused when the printed circuit board 140 is bent may be suppressed.

Driving Unit

Figure 7:
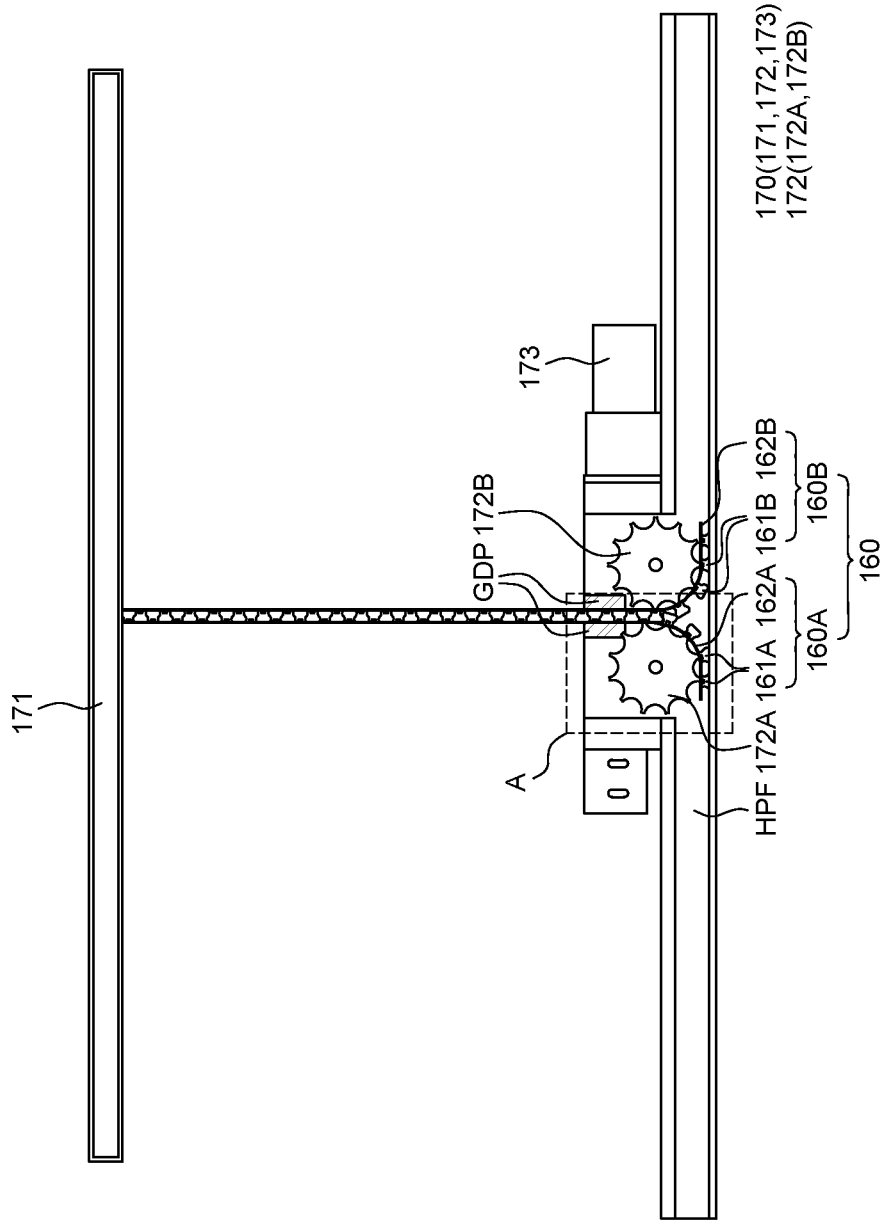
FIG. 7 is a plan view of a driving unit of a display device according to an exemplary embodiment of the present disclosure.
Figure 8:
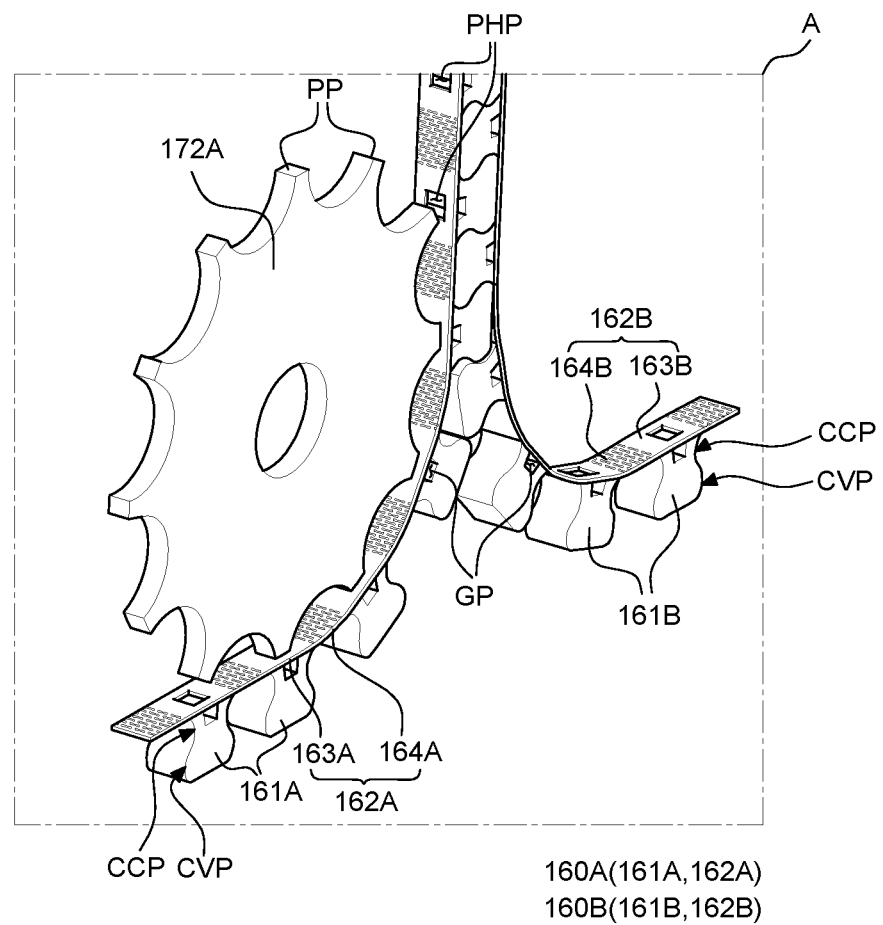
FIG. 8 is an enlarged perspective view of a portion A of FIG. 7 according to an exemplary embodiment of the present disclosure.
Figure 9:
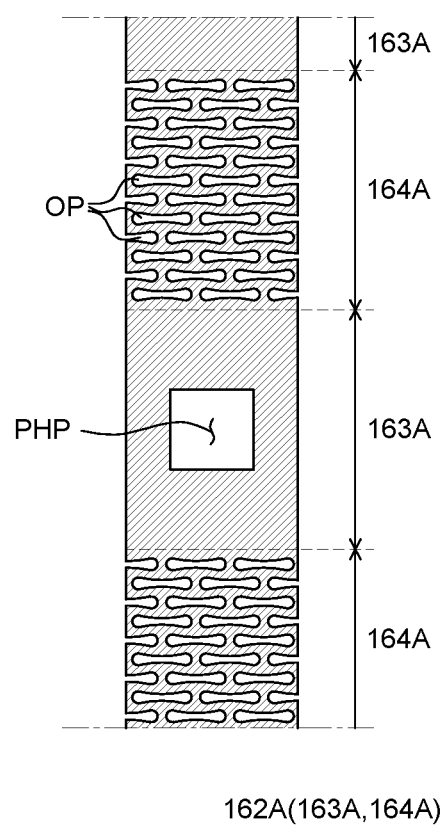
FIG. 9 is a plan view of a plate of a driving unit according to an exemplary embodiment of the present disclosure.

FIG. 6 is a perspective view of a driving unit of a display device according to an exemplary embodiment of the present disclosure. FIG. 7 is a plan view of a driving unit of a display device according to an exemplary embodiment of the present disclosure. FIG. 8 is an enlarged perspective view of a portion A of FIG. 7. FIG. 9 is a plan view of a plate of a driving unit. FIG. 6 is a perspective view of a driving unit MP seen from an area corresponding to a front surface of a fixing surface HPF of the housing unit HP. FIG. 7 is a plan view of a driving unit MP seen from an area corresponding to a rear surface of the fixing surface HPF of the housing unit HP. For the convenience of illustration, in FIG. 7, only the lifting unit 160 and a transporting unit 170 are illustrated and in FIG. 8, only the lifting unit 160 and a first sprocket 172A are illustrated.

Referring to FIGS. 6 to 9, the driving unit MP includes the roller unit 150, the lifting unit 160, and the transporting unit 170.

First, referring to FIG. 6, the roller unit 150 rotates in a clockwise direction or a counterclockwise direction to wind or unwind the display unit DP fixed to the roller unit 150. The roller unit 150 is disposed in the housing unit HP illustrated in FIGS. 1A to 2. The roller unit 150 includes a roller 151 and a roller support unit 152.

A lower edge of the display unit DP is fixed to the roller 151. Therefore, when the roller 151 rotates in the clockwise direction or the counterclockwise direction, the display unit DP may be wound around or unwound from the roller 151.

The roller support unit 152 supports the roller 151 at both sides of the roller 151. Specifically, the roller support unit 152 is disposed on a bottom surface HPB of the housing unit HP. Upper side surfaces of the roller support unit 152 are coupled to both ends of the roller 151. By doing this, the roller support unit 152 may support the roller 151 to be spaced apart from the bottom surface HPB of the housing unit HP. In this case, the roller 151 may be rotatably coupled to the roller support unit 152.

Referring to FIGS. 6 and 7, the lifting unit 160 is disposed in the middle of one surface of the back cover 110. Specifically, the lifting unit 160 may be disposed in the form of a straight line on an opposite surface of the surface of the back cover 110 on which the display panel is disposed so as to correspond to the center in a horizontal direction of the back cover 110. In this case, the lifting unit 160 may be disposed to be perpendicular to an extending direction of the roller 151 and an extending direction of the head bar 171. That is, the lifting unit 160 overlapping the unwound back cover 110 and the unwound display panel 120 may be disposed to correspond to the center of the back cover 110 and the display panel 120 in a direction perpendicular to the roller 151. Further, the lifting unit 160 may be fastened with the head bar 171. Further, the lifting unit 160 is engaged with the sprocket 172 to be described below to move in a vertical direction by the rotation of the sprocket 172. Therefore, the lifting unit 160 may move the back cover 110 fixed to the head bar 171 and the display panel 120 disposed on the back cover 110 in the vertical direction.

Referring to FIGS. 7 and 8, the lifting unit 160 includes a first lifting unit 160A and a second lifting unit 160B. The first lifting unit 160A includes a plurality of first unit blocks 161A and a first plate 162A. The second lifting unit 160B includes a plurality of second unit blocks 161B and a second plate 162B. The plurality of first unit blocks 161A and the plurality of second unit blocks 161B are disposed to be engaged with each other. First, the first lifting unit 160A moves while being engaged with the first sprocket 172A and the second lifting unit 160B moves while being engaged with the second sprocket 172B. Therefore, the back cover 110 and the display panel 120 move in a vertical direction by moving the first lifting unit 160A and the second lifting unit 160B engaged with each other.

The plurality of first unit blocks 161A of the first lifting unit 160A are spaced apart from each other to be disposed on the first plate 162A. A groove GP is formed on a top surface of each of the plurality of first unit blocks 161A. In the groove GP, a protrusion PP of the first sprocket 172A is inserted. A concave portion CCP and a convex portion CVP are formed on both side surfaces of the plurality of first unit blocks 161A. In this case, both side surfaces of the first unit block 161A may be surfaces extending from the top surface on which the groove GP is formed to a bottom surface facing the top surface. Further, one of both side surfaces of the first unit block 161A may be opposite to one of both side surfaces of the other adjacent first unit block 161A. The concave portion CCP is an area which extends from the top surface of the first unit block 161A to be concave. The convex portion CVP is an area which extends from the concave portion CCP to be convex to be connected to a bottom surface of the first unit block 161A. However, the shape of the plurality of first unit blocks 161A is not limited thereto.

Referring to FIGS. 8 and 9, the first plate 162A of the first lifting unit 160A fixes the plurality of first unit blocks 161A. For example, the plurality of first unit blocks 161A may be fixed to the first plate 162A in one line. The first plate 162A includes a plurality of first areas 163A and a plurality of second areas 164A, and the first areas 163A and the second areas 164A may be alternately disposed.

The plurality of first areas 163A is fixed to the top surfaces of the plurality of first unit blocks 161A. The plurality of first areas 163A includes holes PHP corresponding to the grooves GP of the top surfaces of the first unit block 161A. Therefore, the protrusion PP of the first sprocket 172A is inserted into the groove GP and the hole PHP so that the first lifting unit 160A and the first sprocket 172A are engaged with each other. Further, the first lifting unit 160A moves by the rotation of the first sprocket 172A so that the back cover 110 and the display panel 120 move in the vertical direction.

The plurality of second areas 164A connects the adjacent first areas 163A. In this case, the plurality of second areas 164A is not in contact with the plurality of first unit blocks 161A. That is, the plurality of second areas 164A may correspond to spaces between the first unit blocks 161A spaced apart from each other. Each of the plurality of second areas 164A includes a plurality of openings OP. Therefore, when the first lifting unit 160A is bent while being in contact with the first sprocket 172A, a stress applied to the first plate 162A may be minimized.

To be more specific, referring to FIGS. 7 and 8, a part of the first lifting unit 160A disposed above the first sprocket 172A is disposed as a straight line to move in a vertical direction in accordance with the rotation of the first sprocket 172A. In this case, the first lifting unit 160A disposed in the form of a straight line may be perpendicular to the roller 151 and the head bar 171. A part of the first lifting unit 160A engaged with the first sprocket 172A may be bent in accordance with the shape of the first sprocket 172A. Further, a part of the first lifting unit 160A disposed below the first sprocket 172A may move in a horizontal direction in accordance with the rotation of the first sprocket 172A.

That is, the part of the first lifting unit 160A engaged with the first sprocket 172A may be bent as a curve. Therefore, a stress may be generated in the first plate 162A of the first lifting unit 160A due to the bending. Specifically, the first area 163A of the first plate 162A is fixed to the top surface of the first unit block 161A so that the stress may be concentrated onto the second area 164A between adjacent first areas 163A.

In the display device 100 according to the exemplary embodiment of the present disclosure, the second area 164A of the first plate 162A includes a plurality of openings OP. The second area 164A may be deformed by the contraction or expansion of the plurality of openings OP. For example, when the first plate 162A is bent while being engaged with the first sprocket 172A, a stress is applied to deform the first plate 162A in the vertical direction. In this case, the plurality of openings OP of the second area 164A may extend in the vertical direction and the length of the second area 164A may be flexibly deformed. Therefore, when the first plate 162A is bent, the stress applied to the second area 164A may be minimized.

Referring to FIG. 8, the plurality of openings OP is disposed to be staggered from a plurality of openings OP in adjacent rows. For example, a plurality of openings OP disposed in one row is disposed to be staggered from a plurality of openings OP disposed in a row adjacent to the row. Specifically, centers of the plurality of openings OP disposed in an odd-numbered row and centers of the plurality of openings OP disposed in an even-numbered row may be staggered.

Further, a maximum width of the horizontal direction of the plurality of openings OP is larger than a maximum width of the vertical direction. Here, the vertical direction is a direction parallel to the vertical direction where the display panel 120 and the lifting unit 160 move and is parallel to a length direction of the first plate 162A. When the first plate 162A is bent, the first plate 162A may be bent in the vertical direction and a stress is applied to the plurality of openings OP to extend in the vertical direction. Therefore, the width of the horizontal direction of the plurality of openings OP is increased so that the width of the plurality of openings OP which extends in the vertical direction is increased. Accordingly, the plurality of openings OP easily extends in the vertical direction so that the stress applied to the second area 164A is alleviated.

The second lifting unit 160B is configured to be the same as the first lifting unit 160A. That is, the second lifting unit 160B includes a plurality of second unit blocks 161B spaced apart from each other and a second plate 162B which fixes the plurality of second unit blocks 161B. A groove GP is formed on a top surface of each of the plurality of second unit blocks 161B. A concave portion CCP and a convex portion CVP are formed on both side surfaces extending from the top surfaces of the plurality of second unit blocks 161B. The second plate 162B includes a plurality of first areas 163B in which holes PHP is formed and a plurality of second areas 164B in which a plurality of openings OP is formed.

Referring to FIG. 7, the first lifting unit 160A and the second lifting unit 160B are disposed to be engaged with each other. Specifically, the first lifting unit 160A and the second lifting unit 160B are disposed to be engaged with each other from an area between the first sprocket 172A and the second sprocket 172B to the head bar 171. In this case, both side surfaces of the plurality of first unit blocks 161A and the plurality of second unit blocks 161B on which the concave portions CCP and the convex portions CVP are formed may be in contact with each other.

Specifically, the concave portion CCP of the first unit block 161A is in contact with the convex portion CVP of the second unit block 161B adjacent thereto. Further, the convex portion CVP of the first unit block 161A is in contact with the concave portion CCP of the second unit block 161B adjacent thereto. In this case, the bottom surface of the first unit block 161A which is in contact with the second unit block 161B is in contact with the second area 164B of the second plate 162B. Further, the bottom surface of the second unit block 161B which is in contact with the first unit block 161A is in contact with the second area 164A of the first plate 162A.

Referring to FIGS. 6 and 7, the transporting unit 170 includes a head bar 171, a sprocket 172, and a motor 173. The transporting unit 170 moves the display unit DP in a vertical direction together with the lifting unit 160 in accordance with the driving of the roller unit 150.

The head bar 171 is fixed to an uppermost end of the display unit DP. Specifically, the head bar 171 may be fixed to the support area PA of the back cover 110. The head bar 171 covers only a part of a surface which is adjacent to an uppermost edge of the back cover 110 so as not to hide an image displayed on the front surface of the display panel 120. The back cover 110 and the head bar 171 may be fixed by a screw SC1, but are not limited thereto.

A fixing unit 171a is disposed in the center of the head bar 171. The fixing unit 171a fixes an end of the lifting unit 160 to the head bar 171. Therefore, the display unit DP fixed to the head bar 171 also moves in a vertical direction together with the movement of the lifting unit 160. The fixing unit 171a and the lifting unit 160 may be fixed by a screw SC2, but are not limited thereto.

The sprocket 172 is disposed in the housing unit HP. For example, the sprocket 172 may be fixed to the fixing surface HPF in the housing unit HP. In this case, the sprocket 172 may be disposed in the center of the fixing surface HPF so as to correspond to the lifting unit 160. The sprocket 172 may rotate by the rotation of the motor 173. Further, the sprocket 172 may rotate so as to correspond to the rotation of the roller 151.

The sprocket 172 includes a first sprocket 172A and a second sprocket 172B. Each of the first sprocket 172A and the second sprocket 172B includes a plurality of protrusions PP. The protrusions PP of the first sprocket 172A are inserted into the holes PHP and the grooves GP of the first lifting unit 160A to allow the first sprocket 172A to be engaged with the first lifting unit 160A. The protrusions of the second sprocket 172B are inserted into the holes PHP and the grooves GP of the second lifting unit 160B to allow the second sprocket 172B to be engaged with the second lifting unit 160B. The sprocket 172 and the lifting unit 160 are engaged so that the lifting unit 160 may move by the rotation of the sprocket 172.

The motor 173 is disposed in the housing unit HP. The motor 173 is connected to a power generating unit, such as a separate external power source or a built-in battery, to be supplied with the power. The motor 173 generates a torque to provide a driving force to the sprocket 172.

The motor 173 and the sprocket 172 interwork with the lifting unit 160 to lift and lower the display unit DP. Specifically, as the motor 173 is driven, the sprocket 172 may perform the rotational motion. The lifting unit 160 moves by the rotational motion of the sprocket 172.

For example, with respect to FIG. 7, the first sprocket 172A rotates in a clockwise direction and the second sprocket 172B rotates in a counterclockwise direction. Therefore, the first lifting unit 160A and the second lifting unit 160B move down and the heights of the first lifting unit 160A and the second lifting unit 160B which are engaged each other at the upper portion of the sprocket 172 may be lowered. Further, the head bar 171 fixed to the lifting unit 160 moves down together with the lifting unit 160 and an end of the display unit DP connected to the head bar 171 moves down. Accordingly, when the display unit DP is fully wound around the roller 151, the lifting unit 160 may have a smallest height.

In contrast, when the display unit DP is unwound, the first sprocket 172A rotates in the counterclockwise direction and the second sprocket 172B rotates in the clockwise direction. Therefore, the first lifting unit 160A and the second lifting unit 160B move up and the heights of the first lifting unit 160A and the second lifting unit 160B engaged with each other at the upper portion of the sprocket 172 may be increased. Further, the head bar 171 fixed to the lifting unit 160 moves up together with the lifting unit 160 and an end of the display unit DP connected to the head bar 171 moves up. Accordingly, when the display unit DP is fully unwound around the roller 151, the lifting unit 160 may have a largest height.

Referring to FIG. 7, a guide unit GDP is disposed in an area of the fixing surface HPF in the housing unit HP which corresponds to the lifting unit 160. The guide units GDP may be disposed at one side and the other side of the lifting unit 160, respectively. When the lifting unit 160 moves in the vertical direction, the rocking may be more effectively suppressed by the guide unit GDP. Even though in FIG. 7, it is illustrated that the display device 100 includes the guide unit GDP, the present disclosure is not limited thereto and the guide unit GDP may be omitted.

When a telescopic chain is applied as the lifting unit, the number of components is increased, and the structure becomes complex so that a tolerance between components may be caused. Therefore, when the back cover 110 and the display panel 120 move in the vertical direction by the lifting unit to which the telescopic chain is applied, the rocking is caused so that the durability of the display device 100 may be lowered. Further, the number of components of the telescopic chain is increased in accordance with the complex structure so that the manufacturing cost may be increased.

Therefore, in the display device 100 according to the exemplary embodiment of the present disclosure, the lifting unit 160 includes a first lifting unit 160A and a second lifting unit 160B which are engaged with each other. Further, each of the lifting units 160A and 160B includes a plurality of unit blocks 161A and 161B and plates 162A and 162B. Therefore, the number of components of the lifting unit 160 is reduced and the structure is simplified so that the competitive price of the display device 100 may be ensured.

When the first lifting unit 160A and the second lifting unit 160B are engaged with each other, both side surfaces of the plurality of first unit blocks 161A and both side surfaces of the plurality of second unit blocks 161B may be in completely contact with each other. Further, bottom surfaces of the plurality of first unit blocks 161A are in completely contact with the second plate 162B and bottom surfaces of the plurality of second unit blocks 161B are in completely contact with the first plate 162A. That is, the contact area of the first lifting unit 160A and the second lifting unit 160B which are engaged with each other may be widened. Accordingly, the durability of the lifting unit 160 is improved so that when the lifting unit 160 moves in the vertical direction, the rocking may be reduced. Therefore, the back cover 110 and the display panel 120 may move in the vertical direction while being firmly supported by the lifting unit 160 and the reliability of the display device 100 may be improved.

Moreover, a plurality of openings OP is formed in the second areas 164A and 164B of the plates 162A and 162B. Therefore, when the lifting unit 160 is bent while being engaged with the sprocket 172, the stress applied to the plates 162A and 162B may be reduced. That is, the lifting unit 160 is easily bent and move so that the reliability of the operation in the vertical direction of the back cover 110 and the display panel 120 may be improved.

Various Structures of Driving Unit

Figure 10:
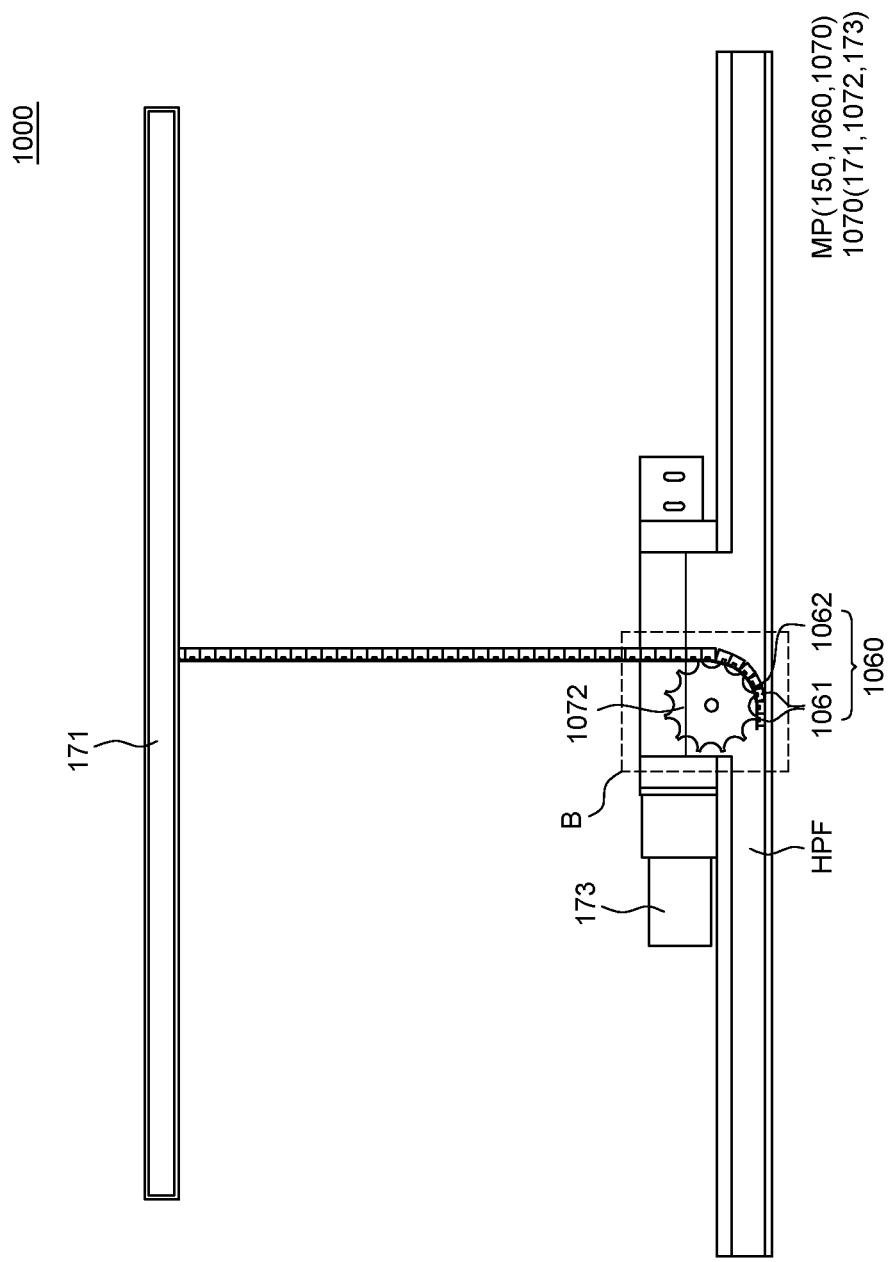
FIG. 10 is a plan view of a driving unit of a display device according to another exemplary embodiment of the present disclosure.
Figure 11:
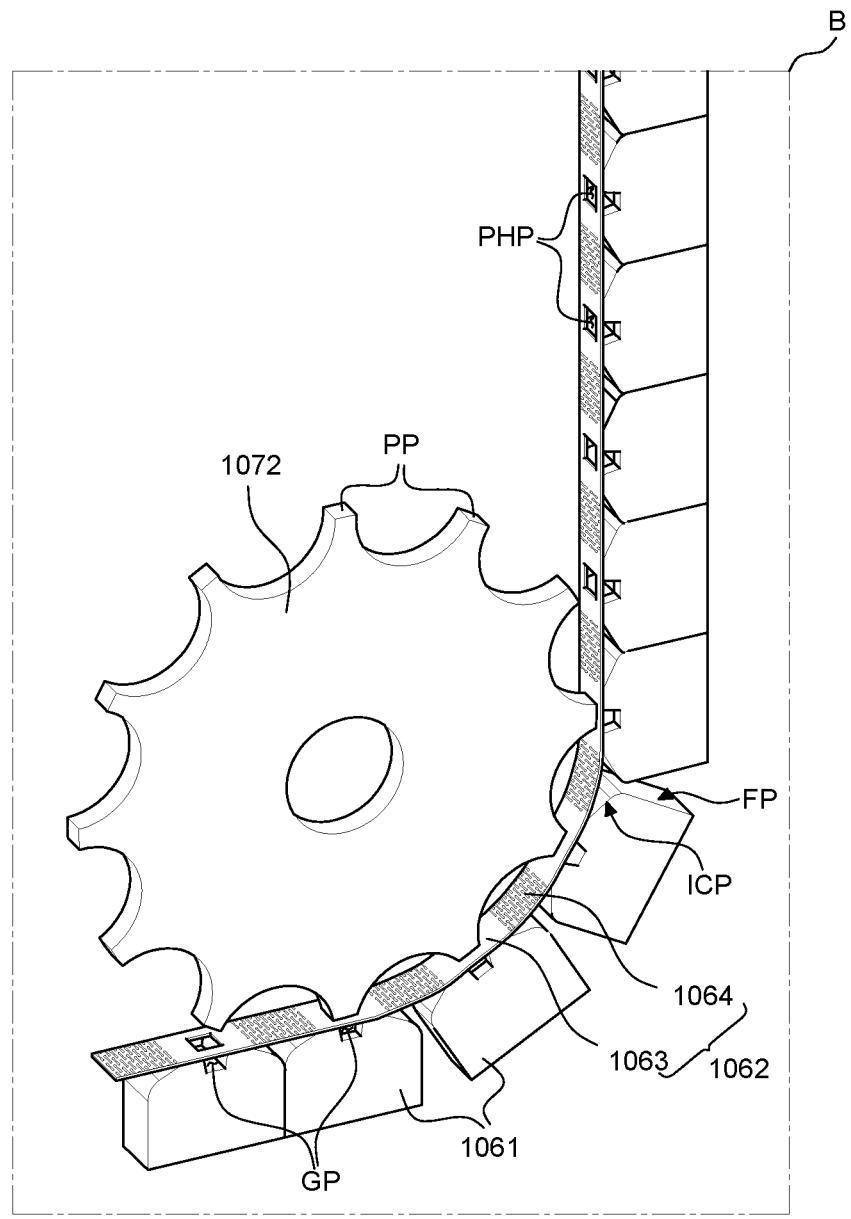
FIG. 11 is an enlarged perspective view of a portion B of FIG. 10 according to an exemplary embodiment of the present disclosure.

FIG. 10 is a plan view of a driving unit of a display device according to another exemplary embodiment of the present disclosure. FIG. 11 is an enlarged perspective view of a portion B of FIG. 10. FIG. 10 is a plan view of a driving unit MP seen from an area corresponding to a rear surface of the fixing surface HPF of the housing unit HP. In FIG. 10, only a lifting unit 1060 and a transporting unit 1070 of a driving unit MP are illustrated. The driving unit MP of the display device 1000 illustrated in FIGS. 10 and 11 is substantially the same as the driving unit MP of the display device 100 illustrated in FIGS. 1A to 9 except for a lifting unit 1060 and a transporting unit 1070, so that a redundant description will be omitted.

First, referring to FIG. 10, the driving unit MP includes a roller unit 150, a lifting unit 1060, and a transporting unit 1070. In this case, an end of the lifting unit 1060 is fixed to a center of the head bar 171. That is, the lifting unit 1060 is disposed in the center of one surface of the back cover 110. Further, the lifting unit 1060 may be disposed to be perpendicular to an extending direction of the head bar 171. The lifting unit 1060 is engaged with the sprocket 1072 to move in a vertical direction by the rotation of the sprocket 1072. Therefore, the lifting unit 1060 may move the back cover 110 fixed to the head bar 171 and the display panel 120 disposed on the back cover 110 in the vertical direction.

The lifting unit 1060 includes a plurality of unit blocks 1061 and a plate 1062.

Referring to FIG. 11, a groove GP is formed on a top surface of each of the plurality of unit blocks 1061. In the groove GP, a protrusion PP of the sprocket 1072 is inserted. An inclined portion ICP and a flat portion FP are formed on both sides of the plurality of unit blocks 1061. The inclined portion ICP is an area which slantly extends from a top surface on which the groove GP is formed. The flat portion FP is an area which extends from the inclined portion ICP to be connected to the bottom surface of the unit block 1061. One of flat portions FP of both side portions of one-unit block 1061 may face or may be in contact with one of a flat portion FP of both side portions of another adjacent unit block 1061.

The plate 1062 fixes the plurality of unit blocks 1061 in one line. The plate 1062 includes a plurality of first areas 1063 and a plurality of second areas 1064 and the first areas 1063 and the second areas 1064 may be alternately disposed. A specific structure of the plate 1062 may be substantially the same as the first plate 162A and the second plate 162B which have been described with reference to FIGS. 1A to 9.

The plurality of first areas 1063 is fixed to the top surfaces of the plurality of unit blocks 1061. The plurality of first areas 1063 includes holes PHP corresponding to the grooves GP of the top surfaces of the unit blocks 1061. The protrusion PP of the sprocket 1072 is inserted into the groove GP and the hole PHP so that the lifting unit 1060 and the sprocket 1072 are engaged with each other. Further, the lift unit 1060 moves by the rotation of the sprocket 1072 so that the back cover 110 and the display panel 120 move in the vertical direction.

The plurality of second areas 1064 connects the adjacent first areas 1063. In this case, the plurality of second areas 1064 is not in contact with the plurality of unit blocks 1061. That is, the plurality of second areas 1064 corresponds to the inclined portion ICP extending from the top surface of the unit block 1061 to be spaced apart from the unit block 1061. Further, each of the plurality of second areas 1064 includes a plurality of openings OP, as illustrated in FIG. 9. Therefore, when the lifting unit 1060 is bent while being in contact with the sprocket 1072, the stress applied to the plates 1062 may be reduced.

Referring to FIGS. 10 and 11, a part of the lifting unit 1060 which is disposed above the sprocket 1072 is disposed as a straight line to move in a vertical direction in accordance with the rotation of the sprocket 1072. In this case, the lifting unit 1060 disposed above the sprocket 1072 is disposed such that flat portions FP of adjacent unit blocks 1061 are in contact with each other. That is, the lifting unit 1060 which overlaps the unwound back cover 110 and display panel 120 may be disposed such that the flat portions FP of adjacent unit blocks 1061 are in contact with each other. The part of the lifting unit 1060 engaged with the sprocket 1072 may be bent in accordance with the shape of the sprocket 1072. In this case, the lifting unit 1060 which is engaged with the sprocket 1072 is disposed such that flat portions FP of adjacent unit blocks 1061 are spaced apart from each other. Further, a part of the lifting unit 1060 which is disposed below the sprocket 1072 is disposed as a straight line to move in a horizontal direction in accordance with the rotation of the sprocket 1072. In this case, the lifting unit 1060 disposed below the sprocket 1072 is disposed such that flat portions FP of adjacent unit blocks 1061 are in contact with each other.

The sprocket 1072 may be fixed to a fixing surface HPF in the housing unit HP. Specifically, the sprocket 1072 may be disposed in the center of the fixing surface HPF so as to correspond to the lifting unit 1060. The sprocket 1072 may rotate by the rotation of the motor 173. Further, the sprocket 1072 may rotate so as to correspond to the rotation of the roller 151. The sprocket 1072 includes a plurality of protrusions PP which is inserted into the holes PHP and the grooves GP of the lifting unit 1060 to be engaged with the lifting unit 1060.

In the meantime, in the display device 1000 according to another exemplary embodiment of the present disclosure, one lifting unit 1060 and one sprocket 1072 may be disposed. Even though in FIG. 10, the lifting unit 1060 and the sprocket 1072 are disposed to be engaged with each other at a left side with respect to the center of the head bar 171, it is not limited thereto. Therefore, the lifting unit 1060 and the sprocket 1072 may be engaged with each other at a right side with respect to the center of the head bar 171.

In the display device 1000 according to another exemplary embodiment of the present disclosure, the lifting unit 1060 includes a plurality of unit blocks 1061 and a plate 1062. Further, the lifting unit 1060 may move while being engaged with the sprocket 1072. Specifically, when the lifting unit 1060 moves above the sprocket 1072 in the vertical direction, the flat portions FP of both side portions of the plurality of unit blocks 1061 are disposed in one-line while being in completely contact with each other. That is, the plurality of unit blocks 1061 which moves in the vertical direction may be disposed in one line with a large contact area. Accordingly, the durability of the lifting unit 1060 is improved so that when the lifting unit 1060 moves in the vertical direction, the rocking may be reduced. Therefore, the back cover 110 and the display panel 120 may move in the vertical direction while being firmly supported by the lifting unit 1060 and the reliability of the display device 1000 may be improved.

Further, in the display device 1000 according to another exemplary embodiment of the present disclosure, the driving unit MP may include only one lifting unit 1060 and one sprocket 1072. As a result, the structure of the driving unit MP is simplified, and the number of components may be reduced. Therefore, the manufacturing cost of the display device 1000 is saved to ensure the competitive price.

Protection of Edge of Back Cover and Improvement of Risk

Figure 12:
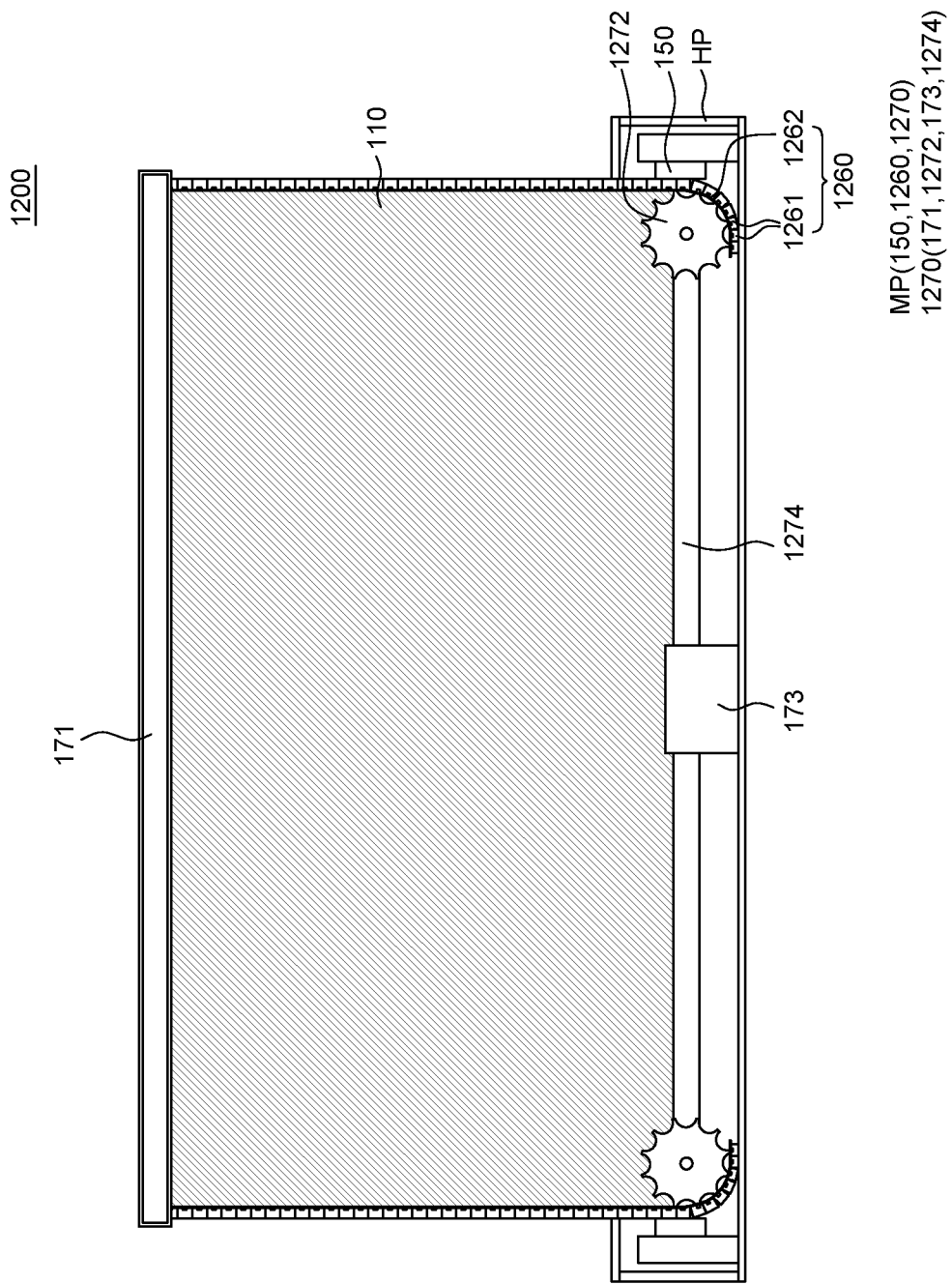
FIG. 12 is a plan view of a display device according to still another exemplary embodiment of the present disclosure.

FIG. 12 is a plan view of a display device according to still another exemplary embodiment of the present disclosure. In FIG. 12, only a lifting unit 1260 and a transporting unit 1270 of a driving unit MP are illustrated. The driving unit MP of the display device 1200 illustrated in FIG. 12 is substantially the same as the driving unit MP of the display device 100 illustrated in FIGS. 1A to 9 except for a lifting unit 1260 and a transporting unit 1270, so that a redundant description will be omitted.

Referring to FIG. 12, the driving unit MP includes a roller unit 150, a lifting unit 1260, and a transporting unit 1270.

The lifting units 1260 are disposed on both ends of the back cover 110, respectively. Specifically, the lifting unit 1260 is fixed on both ends of the head bar 171 to be disposed at a left side and a right side of the back cover 110. In this case, the lifting unit 1260 may be disposed at the outside from the back cover 110 and the display panel 120 while enclosing both ends of the back cover 110. The lifting unit 1260 may be disposed to be perpendicular to an extending direction of the head bar 171. The lifting unit 1260 is engaged with the sprocket 1272 to move in a vertical direction by the rotation of the sprocket 1272. Therefore, the lifting unit 1260 may move the back cover 110 fixed to the head bar 171 and the display panel 120 disposed on the back cover 110 in the vertical direction.

The lifting unit 1260 includes a plurality of unit blocks 1261 and a plate 1262. A specific structure of the plurality of unit blocks 1261 and the plate 1262 may be the substantially the same as the plurality of unit blocks 1061 and the plate 1062 which have been described above with reference to FIGS. 10 and 11.

The transporting unit 1270 includes a head bar 171, a sprocket 1272, a motor 173, and a rotary unit 1274.

The sprocket 1272 is disposed so as to be engaged with the lifting unit 1260. The sprockets 1272 may be disposed at a left side and a right side of the back cover 110 so as to correspond to the lifting units 1260 disposed at the left side and the right side of the back cover 110.

The rotary unit 1274 is connected to the motor 173. The rotary unit 1274 is disposed so as to connect between the sprockets 1272 disposed at the left side and the right side of the back cover 110 and the motor 173. The rotary unit 1274 may transmit the rotational motion of the motor 173 to the sprocket 1272. Therefore, the sprocket 1272 may rotate by the rotary unit 1274. In this case, the rotary unit 1274 and the sprocket 1272 may be implemented as a bevel gear.

In the display device 1200 according to still another exemplary embodiment of the present disclosure, the lifting units 1260 and the sprockets 1272 corresponding thereto are disposed at both a left side and a right side of the back cover 110. That is, the lifting units 1260 are fixed to the left side and the right side of the head bar 171 to which the back cover 110 is fixed. Therefore, the back cover 110 and the display panel 120 may move in a vertical direction while being firmly supported by the head bar 171 and the lifting units 1260 fixed to both ends of the head bar 171. Therefore, when the display unit DP moves in the vertical direction, the rocking is reduced so that the reliability of the display device 1200 is improved.

Since the back cover 110 may be formed of a metal material or a plastic material having a rigidity so that the left end and the right end of the back cover 110 may be very sharp. Further, when the back cover 110 is thick, much stress may be generated to wind and unwind the display panel 120 and the back cover 110. The back cover 110 itself may undergo plastic deformation so that the back cover 110 may be formed to have a very small thickness of approximately 200 μm. Therefore, the thin and sharp end of the back cover 110 is vulnerable to the external impact to be easily deformed and there is a risk that the user may be injured by the sharp end.

Therefore, in the display device 1200 according to still another exemplary embodiment of the present disclosure, the lifting unit 1260 is disposed at the outside more than the end of the back cover 110 so that the sharp end may be improved. Specifically, the lifting unit 1260 is disposed at the outside more than the both ends so as to enclose both ends of the back cover 110 so that the plurality of unit blocks 1261 may be disposed in both outermost peripheral portions of the display device 1200. Therefore, even though the user touches the plurality of unit blocks 1261, the plurality of unit blocks 1261 provides a flat surface so that the risk of the injury of the user due to the back cover 110 may be reduced.

Further, in the display device 1200 according to still another exemplary embodiment of the present disclosure, the thickness of the plurality of unit blocks 1261 disposed at both outermost peripheries of the display device 1200 may be larger than the thickness of the back cover 110. Therefore, the rigidity of both outermost peripheral portions of the display device 1200 is improved. Further, even though the external force is applied to the left side and the right side, the deformation of the back cover 110 and the display panel 120 may be reduced.

The exemplary embodiments of the present disclosure can also be described as follows:

According to an aspect of the present disclosure, there is provided a display device. The display device includes a display panel including a plurality of pixels. The display device further includes a roller to which the display panel is wound or unwound. The display device further includes a lifting unit configured to move the display panel in a vertical direction. The lifting unit lifting unit includes a plurality of unit blocks and a plate to which the plurality of unit blocks is fixed.

Each of the plurality of unit blocks may include a groove. The plate may include a plurality of first areas fixed to one surface of the plurality of unit blocks and including a hole corresponding to the groove. The plate may further include a plurality of second areas between the plurality of first areas including a plurality of openings.

A width of the plurality of openings in a first direction may be smaller than a width in a second direction perpendicular to the first direction and the first direction may be parallel to a length direction of the plate.

The plate may include a first plate and a second plate. The plurality of unit blocks may include a plurality of first unit blocks and a plurality of second unit blocks. The lifting unit may include a first lifting unit including the first plate and the plurality of first unit blocks fixed to the first plate. The lifting unit may further include a second lifting unit including the second plate and the plurality of second unit blocks fixed to the second plate.

The first lifting unit and the second lifting unit may be disposed to be engaged with each other and the lifting unit overlapping the unwound display panel may be disposed to correspond to a center of the display panel in a direction perpendicular to the roller.

When the first lifting unit and the second lifting unit may be engaged with each other, the first plate is in contact with the plurality of second unit blocks and the second plate is in contact with the plurality of first unit blocks.

A concave portion and a convex portion may be disposed on both side surfaces of each of the plurality of first unit blocks and the plurality of second unit blocks. When the first lifting unit and the second lifting unit may be engaged with each other, the concave portions of the plurality of first unit blocks are in contact with the convex portions of the plurality of second unit blocks, and the convex portions of the plurality of first unit blocks are in contact with the concave portions of the plurality of second unit blocks.

The first lifting unit and the second lifting unit may be disposed at a left side and a right side of the display panel, respectively.

The first lifting unit and the second lifting unit may be disposed at outside of the display panel.

Flat portions may be disposed on both side portions of each of the plurality of first unit blocks and the plurality of second unit blocks, and the lifting unit overlapping the unwound display panel may be disposed such that flat portions of the plurality of first unit blocks are in contact with each other and flat portions of the plurality of second unit blocks may be in contact with each other.

The lifting unit overlapping the unwound display panel may be disposed to correspond to a center of the display panel in a direction perpendicular to the roller.

Flat portions may be disposed on both side portions of each of the plurality of unit blocks, and the lifting unit overlapping the unwound display panel may be disposed such that the flat portions of the plurality of unit blocks are in contact with each other.

The display device may further include a sprocket which rotates correspondingly to the rotation of the roller and includes a plurality of protrusions corresponding to the grooves and the holes. The sprocket may be engaged with the lifting unit by the plurality of protrusions.

The display device may further include a housing unit which accommodates the roller. The display device may further include a guide member disposed in the housing unit to correspond to one side and the other side of the lifting unit to guide the lifting unit.

According to another aspect of the present disclosure, there is provided a display device. The display device includes a display panel including a plurality of pixels. The display device further includes a back cover configured to be rolled together with the display panel. The display device further includes a roller winding and unwinding the display panel and the back cover. The display device further includes a lifting unit configured to move the display panel in a vertical direction. The lifting unit includes a plurality of unit blocks including a groove formed on a top surface and a plate fixing the plurality of unit blocks in one line.

The plate may include a plurality of first areas fixed to the top surface of the plurality of unit blocks and including a hole corresponding to the groove. The plate may further include a plurality of second areas between the plurality of first areas and including a plurality of openings.

The display device may further include a sprocket which rotates correspondingly to the rotation of the roller and includes a plurality of protrusions corresponding to the groove and the hole. The sprocket may be engaged with the lifting unit by the plurality of protrusions.

The lifting unit overlapping the unwound display panel and the unwound back cover may be disposed to correspond to a center of the back cover in a direction perpendicular to the roller.

The lifting unit may include a first lifting unit including a plurality of first unit blocks spaced apart from each other. The lifting unit may further include a second lifting unit including a plurality of second unit blocks spaced apart from each other. The lifting unit may further include the plurality of first unit blocks and the plurality of second unit blocks disposed to be engaged with each other.

The lifting unit overlapping the unwound display panel and the unwound back cover may be disposed at a left side and a right side of the back cover in a direction perpendicular to the roller.

The display device may further include a head bar fastened with an upper end of the back cover and an upper end of the lifting unit.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a display panel including a plurality of pixels;
   a roller to which the display panel is wound or unwound; and
   a lifting unit configured to move the display panel in a vertical direction, the lifting unit including:
   a plurality of unit blocks; and
   a plate to which the plurality of unit blocks is fixed,
   wherein each of the plurality of unit blocks includes a groove,
   wherein the plate includes:
   a plurality of first areas fixed to one surface of the plurality of unit blocks and including a hole corresponding to the groove; and
   a plurality of second areas between the plurality of first areas and including a plurality of openings.

2. The display device according to claim 1, wherein a width of the plurality of openings in a first direction is smaller than a width in a second direction perpendicular to the first direction and the first direction is parallel to a length direction of the plate.

3. The display device according to claim 1, wherein the plate includes a first plate and a second plate,
   wherein the plurality of unit blocks includes a plurality of first unit blocks and a plurality of second unit blocks,
   wherein the lifting unit includes:
   a first lifting unit including the first plate and the plurality of first unit blocks fixed to the first plate; and
   a second lifting unit including the second plate and the plurality of second unit blocks fixed to the second plate.

4. The display device according to claim 3, wherein the first lifting unit and the second lifting unit are disposed to be engaged with each other and the lifting unit overlapping the unwound display panel is disposed to correspond to a center of the display panel in a direction perpendicular to the roller.

5. The display device according to claim 4, wherein when the first lifting unit and the second lifting unit are engaged with each other, the first plate is in contact with the plurality of second unit blocks and the second plate is in contact with the plurality of first unit blocks.

6. The display device according to claim 4, wherein a concave portion and a convex portion are disposed on both side surfaces of each of the plurality of first unit blocks and the plurality of second unit blocks,
   wherein when the first lifting unit and the second lifting unit are engaged with each other, the concave portions of the plurality of first unit blocks are in contact with the convex portions of the plurality of second unit blocks, and the convex portions of the plurality of first unit blocks are in contact with the concave portions of the plurality of second unit blocks.

7. The display device according to claim 3, wherein the first lifting unit and the second lifting unit are disposed at a left side and a right side of the display panel, respectively.

8. The display device according to claim 7, wherein the first lifting unit and the second lifting unit are disposed at outside of the display panel.

9. The display device according to claim 7, wherein flat portions are disposed on both side portions of each of the plurality of first unit blocks and the plurality of second unit blocks, and the lifting unit overlapping the unwound display panel is disposed such that flat portions of the plurality of first unit blocks are in contact with each other and flat portions of the plurality of second unit blocks are in contact with each other.

10. The display device according to claim 1, wherein the lifting unit overlapping the unwound display panel is disposed to correspond to a center of the display panel in a direction perpendicular to the roller.

11. The display device according to claim 10, wherein flat portions are disposed on both side portions of each of the plurality of unit blocks, and the lifting unit overlapping the unwound display panel is disposed such that the flat portions of the plurality of unit blocks are in contact with each other.

12. The display device according to claim 1, further comprising:
 a sprocket which rotates correspondingly to a rotation of the roller and includes a plurality of protrusions corresponding to grooves in the plurality of unit blocks and holes of the plurality of first areas,
 wherein the sprocket is engaged with the lifting unit by the plurality of protrusions.

13. The display device according to claim 1, further comprising:
 a housing unit which accommodates the roller; and
 a guide member disposed in the housing unit to correspond to one side and another side of the lifting unit to guide the lifting unit.

14. A display device, comprising:
 a display panel including a plurality of pixels;
 a back cover configured to be rolled together with the display panel;
 a roller winding and unwinding the display panel and the back cover; and
 a lifting unit configured to move the display panel in a vertical direction, the lifting unit including:
  a plurality of unit blocks including a groove formed on a top surface of the plurality of unit blocks; and
  a plate fixing the plurality of unit blocks in one line,
 wherein the plate includes:
  a plurality of first areas fixed to the top surface of the plurality of unit blocks and including a hole corresponding to the groove; and
  a plurality of second areas between the plurality of first areas and including a plurality of openings.

15. The display device according to claim 14, further comprising:
 a sprocket which rotates correspondingly to a rotation of the roller and includes a plurality of protrusions corresponding to the groove and the hole,
 wherein the sprocket is engaged with the lifting unit by the plurality of protrusions.

16. The display device according to claim 14, wherein the lifting unit overlapping the unwound display panel and the unwound back cover is disposed to correspond to a center of the back cover in a direction perpendicular to the roller.

17. The display device according to claim 16, wherein the lifting unit includes:
 a first lifting unit including a plurality of first unit blocks spaced apart from each other; and
 a second lifting unit including a plurality of second unit blocks spaced apart from each other, and
 the plurality of first unit blocks and the plurality of second unit blocks are disposed to be engaged with each other.

18. The display device according to claim 14, wherein the lifting unit overlapping the unwound display panel and the unwound back cover is disposed at a left side and a right side of the back cover in a direction perpendicular to the roller.

19. The display device according to claim 14, further comprising:
 a head bar fastened with an upper end of the back cover and an upper end of the lifting unit.

* * * * *